US010038587B2

(12) United States Patent
Sandell et al.

(10) Patent No.: US 10,038,587 B2
(45) Date of Patent: Jul. 31, 2018

(54) DEMODULATION OF NONUNIFORM QAM SIGNALS

(71) Applicant: Kabushiki Kaisha Toshiba, Minato-ku (JP)

(72) Inventors: Magnus Stig Torsten Sandell, Bristol (GB); Filippo Tosato, Bristol (GB); Amr Ismail, Bristol (GB)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/551,092

(22) PCT Filed: Oct. 22, 2015

(86) PCT No.: PCT/GB2015/053163
§ 371 (c)(1),
(2) Date: Aug. 15, 2017

(87) PCT Pub. No.: WO2017/068311
PCT Pub. Date: Apr. 27, 2017

(65) Prior Publication Data
US 2018/0034680 A1   Feb. 1, 2018

(51) Int. Cl.
*H04L 27/06* (2006.01)
*H04L 27/38* (2006.01)
*H04L 25/06* (2006.01)

(52) U.S. Cl.
CPC .......... *H04L 27/389* (2013.01); *H04L 25/067* (2013.01)

(58) Field of Classification Search
CPC ............ H04L 27/02; H04L 27/06; H03K 9/02
USPC ....................................... 375/353, 268, 320
See application file for complete search history.

(56) References Cited

U.S. PATENT DOCUMENTS 8,166,379 B1   4/2012 Wu et al.
8,793,560 B2*  7/2014 Sidi ...................... H03M 13/256
                                                714/780
(Continued)

FOREIGN PATENT DOCUMENTS

EP     2 611 092 A1    7/2013
WO   WO 2010/111589 A2   9/2010
WO   WO 2014 177565 A1  11/2014

OTHER PUBLICATIONS

International Search Report and Written Opinion dated Jul. 4, 2016 in PCT/GB2015/053163.

(Continued)

*Primary Examiner* — Kevin Kim
(74) *Attorney, Agent, or Firm* — Oblon, McClelland, Maier & Neustadt, L.L.P.

(57) ABSTRACT

There is provided a device and method for demodulating a pulse amplitude modulated, hereinafter referred to as PAM, signal. The device comprises memory storing a set of boundaries of regions in which the log likelihood ratio, hereinafter referred to as LLR, for each bit to be determined is represented by a linear function of the received signal, along with the properties of the linear function for each bit for each region; and a controller. The controller is configured to: receive a PAM signal to be demodulated; determine which region the signal falls within; for each bit to be determined, retrieve the properties of the linear function for the LLR for the bit within the determined region and determine, from this linear function, the LLR value for the bit; and demodulate the signal based on the determined LLR values.

15 Claims, 12 Drawing Sheets

(56) References Cited

U.S. PATENT DOCUMENTS

2007/0260959 A1    11/2007   Sidi et al.
2011/0019726 A1     1/2011   Chappaz

OTHER PUBLICATIONS

K. Hyun, et al., "Bit Metric Generation for Gray Coded QAM Signals: Capacity Approaching Codes Design and Implementation Special Section", IEE Proceedings: Communications.. vol. 152 No. 6, XP006025741, Dec. 9, 2005, pp. 1134-1138.
3GPP . (2014). TS25.212: Multiplexing and Channel Coding (FDD). (Release 12). Retrieved from http://www.3gpp.org/DvnaReport/25212.htm. 167 pages.
Liu, X., & Kosakowski, M. (2015). Max-log-Map Soft Demapper with Logarithmic Complexity for M-PAM Signals. IEEE Signal Processing Letters, 50-53.
Sommer, D., & Fettweis, G. (2000). Signal Shaping by Nonuniform QAM for AWGN Channels and Applications Using Turbo Coding. Proc ITG Conf. Source and Channel Coding, (pp. 81-86).
Tosato, F., & Bisaglia, P. (2001). Simplified Soft-Output Demapper for Binary Interleaved COFDM with Application to HIPERLAN/2. IEEE International Conference on Communications, 2, pp. 664-668.
Zoellner, J., & Loghin, N. (2013). Optimization of High-order non-uniform QAM Constellations. IEEE International Symposium on Broadband Multimedia Systems and Broadcasting (BMSB), (pp. 1-6).
International Preliminary Report on Patentability and Written Opinion of the International Searching Authority dated May 3, 2018 in PCT/GB2015/053163, filed Oct. 22, 2015, 6 pages.

\* cited by examiner

DEMODULATION OF NONUNIFORM QAM SIGNALS

TECHNICAL FIELD

Embodiments relate generally to a device and method for demodulating signals, and in particular, for demodulating nonuniform pulse amplitude modulated (PAM) and quadrature amplitude modulated (QAM) signals.

BACKGROUND

When digital signals are sent across a communication system, it is common to transmit the signals in the form of a modulated carrier signal. This allows the bit rate of data transfer to be increased. After transmission, the received signal must be demodulated to reconstruct the original signal (the content).

Digital modulation schemes use finite numbers of discrete signals. A predefined number of symbols (unique combinations of binary digits) may be assigned for each digital modulation scheme.

Pulse amplitude modulation (PAM) is a modulation scheme which encodes message information according to the amplitude of a series of signal pulses. Each digital symbol is encoded as a value representing a specific amplitude and polarity of the carrier signal. By assigning positive and negative polarities, positive and negative values can be assigned to specific symbols. The received signal can then be demodulated by determining which of these amplitudes the received signal is closest to, and then assigning the symbol corresponding to this amplitude. Amplitude shift keying (ASK) is a type of PAM which modulates the amplitude of a sinusoidal carrier wave.

Quadrature amplitude modulation (QAM) is a modulation scheme which encodes a digital message by modulating the amplitudes of two carrier waves using ASK. The two carrier waves are sinusoids which are out of phase with each other by 90° (a sine wave and a cosine wave). The two carrier waves are summed and can then be demodulated at the receiving end by separating out the two combined carrier waves and determining the corresponding symbol for the amplitude of each carrier wave. QAM effectively utilises two PAM signals sent in parallel.

The set of M symbols for a given modulation scheme can be represented by a constellation diagram. For a binary system, each symbol represents a unique combination of m binary digits, where $m=\log_2 M$. For QAM, each symbol can be represented by a complex number representing a position on the complex plane. The sine and cosine carrier waves are modulated by the real and imaginary parts of the complex number for a given symbol to provide the modulated signal for a given symbol. A coherent demodulator can then independently demodulate the two carrier waves to determine the symbol.

As such, demodulating the received signal may be done considering two points, each being represented in one dimension (by applying two independent PAM demodulators, one to the sine carrier wave signal and one to the cosine carrier wave signal). Embodiments described herein are therefore applicable to any separable QAM constellation arrangement.

Furthermore, where Gray codes are used to modulate the message being sent, all constellation points with the same x coordinate may have the same bit values for the first (or second) half of their Gray code identification and all constellation points with the same y coordinate may have the same bit value for the second (or first) half of their Gray code identification. As such, the consideration of the x and y axis bits can be done independently, with each considering different halves of the total set of bits for the symbol to be decoded.

From information theory it is known that, in addition to coding gain (improved bit error rate from encoding data), shaping gain can be obtained if the amplitude of the transmitter output follows a Gaussian distribution. Conventional quadrature amplitude modulation (QAM) constellations have a uniform distribution. That is, the symbols on the constellation diagram are evenly spaced in the complex plane. This means that there are even divisions between the signal amplitudes assigned to the symbols on the sine and cosine carrier waves.

Efforts have been made to design nonuniform QAM constellations which approximate the Gaussian distribution. One method samples the Gaussian Cumulative Distribution Function (CDF) in a uniform fashion to achieve this goal.

When demodulating a received (noisy) QAM signal, the log-likelihood ratio (LLR) is sought. If the received signal is $y=x+v$, where x is the transmitted QAM symbols and v is the noise, the LLR of the ith bit of the symbol, $b_i(x)$, is defined as $$LLR_i = \log \frac{Pr(b_i(x) = 1 \mid y)}{pr(b_i(x) = 0 \mid y)} \quad [1]$$

That is, the log likelihood ratio for a given bit in a symbol is the log of the probability of the bit being "1" divided by the probability of the bit being "0". Assuming that the a priori probability is the same for all transmitted symbols and using the common max-log approximation, the LLR is often approximated as:

$$LLR_i \approx \frac{1}{\sigma^2} \left( \min_{x \in X_0^{(i)}} |y - x|^2 - \min_{x \in X_1^{(i)}} |y - x|^2 \right) \quad [2]$$

where $X_0^{(i)} = \{x \mid b_i(x)=0\}$, and $X_1^{(i)} = \{x \mid b_i(x)=1\}$, and $\sigma^2$ is the noise variance. That is, $X_0^{(i)}$ and $X_1^{(i)}$ are the set of possible QAM symbols where the $i^{th}$ bit equals 0 and 1 respectively. Hence the distance to all constellation points (all possible symbols) must be found and the minimum over the two subsets ($X_0^{(i)}$ and $X_1^{(i)}$) must then be taken. The complexity of this is O(M) if there are M different QAM symbols, i.e., it is proportional to the number of symbols. For uniform constellations there are efficient methods with complexity $0(\log_2 M)$ and also suboptimal methods with reduced complexity.

Known reduced complexity methods can't be used for nonuniform constellations as they assume that all symbols are equispaced. The straightforward implementation of the max-log expression requires the computation of M distances, which can be time consuming, particularly as the number of possible symbols for the modulation scheme increases.

BRIEF DESCRIPTION OF THE DRAWINGS

Embodiments of the present invention will be understood and appreciated more fully from the following detailed description, made by way of example only and taken in conjunction with drawings in which.

DETAILED DESCRIPTION

Figure 1:
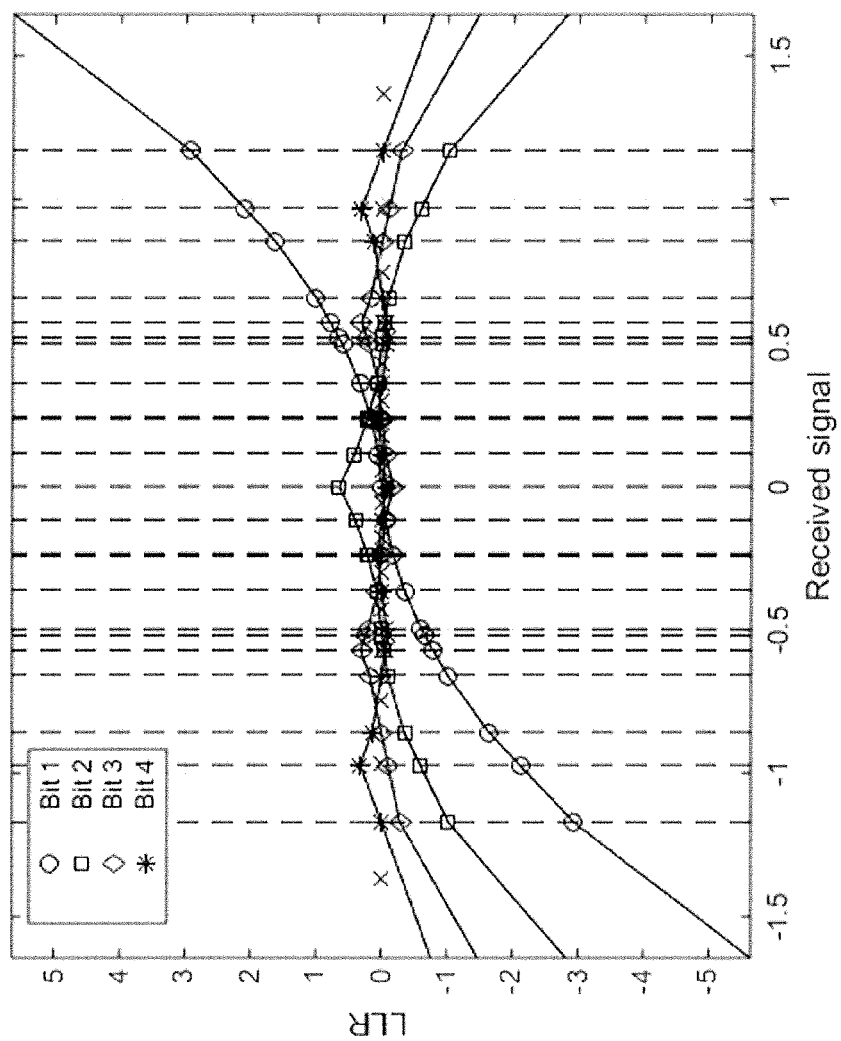
FIG. 1 shows the LLR for each bit in a constellation plotted as a function of the received signal.

According to one embodiment there is provided a device for demodulating a pulse amplitude modulated, hereinafter referred to as PAM signal, the device comprising: memory storing a set of boundaries of regions in which the log likelihood ratio, hereinafter referred to as LLR, for each bit to be determined is represented by a linear function of the received signal, along with the properties of the linear function for each bit for each region; and, a controller. The controller is configured to: receive a PAM signal to be demodulated; determine which region the signal falls within; for each bit to be determined, retrieve the properties of the linear function for the LLR for the bit within the determined region and determine, from this linear function, the LLR value for the bit; and demodulate the signal based on the determined LLR values.

Embodiments provide a means of efficiently demodulating a PAM signal by dividing the max log LLR function into predefined linear regions and utilising predefined linear function parameters for the region in which the signal is located to efficiently calculate the LLR value for each bit. This makes use of the piecewise nature of the max-log LLR functions to help to simplify the demodulation steps. Accordingly, embodiments allow nonuniform PAM constellations to be decoded efficiently. It should be noted that whilst PAM signals are discussed, embodiments are equally applicable to separable QAM constellations through application of the PAM demodulation scheme to the real and imaginary parts of the QAM signal.

According to an embodiment, once the signal has been demodulated, the LLR values for each bit are output. For instance, the LLR values may be output to another device, e.g. via a network, may be output to a monitor or may be processed further by the controller, e.g. to make a hard decision on the bits or to input the LLR values into a decoder.

Determining which region the signal falls within may mean determining the region into which the amplitude of the received signal falls. The amplitude may be positive or negative.

According to one embodiment, the received signal is Gray coded according to a predefined set of symbols, each symbol having its own assigned signal value. The properties of the linear function for each region comprise the gradient and the y-intercept of the linear function within the region. The gradient, $\alpha_i$, and y-intercept, $\beta_i$, for the $i^{th}$ bit for each region obey the following equations:

$$\alpha_i = 2(x_1^{(i)} - x_0^{(i)}); \text{ and}$$

$$\beta_i = (x_0^{(i)})^2 - (x_1^{(i)})^2,$$

wherein $x_0^{(i)}$ and $x_1^{(i)}$ are signal values assigned to the closest symbols to the region out of the symbols in which the $i^{th}$ bit equals 0 and 1 respectively. That is:

$$x_0^{(i)} = \arg\min_{x \in X_0^{(i)}} (y-x)^2, \forall y \in Y; \text{ and}$$

$$x_1^{(i)} = \arg\min_{x \in X_1^{(i)}} (y-x)^2, \forall y \in Y.$$

Accordingly, the linear function parameters are the gradient and y intercept for the linear function in the region and can be predefined and stored in the memory.

The linear function parameters may be calculated by the controller or may be calculated by an external device and input into the device for use by the device in demodulating received signals. The same applies to the boundaries for the linear regions.

According to one embodiment, determining the LLR value for each bit comprises calculating:

$$LLR_i = \frac{\alpha_i y + \beta_i}{\sigma^2}$$

wherein $LLR_i$ is the log likelihood ratio for the $i^{th}$ bit, $\alpha_i$ is the gradient for the $i^{th}$ bit, $\beta_i$ is the y-intercept for the $i^{th}$ bit, y is the received signal and $\sigma$ is a noise variance for the signal. This allows a single table of gradient and y-intercept values to be created, with the values being scaled according to the signal to noise ratio upon calculation of the log likelihood values.

Alternatively, the noise variance may be incorporated into the gradient and y-intercept values so that the alternative gradient $\alpha'_i$ and y-intercept $\beta'_i$ values are $$\alpha'_i = \frac{\alpha_i}{\sigma^2}$$

$$\beta'_i = \frac{\beta_i}{\sigma^2}$$

and the LLR is $$LLR_i = \alpha'_i y + \beta'_i.$$

According to one embodiment, determining which region the signal falls within comprises:
(a) ordering the set of boundaries according size, setting a search index to identify a middle boundary of the set of boundaries and setting an initial step size of a quarter of the total number of regions;
(b) determining whether the received signal is greater than the boundary identified by the search index;

(c) if the signal is greater than the boundary identified by the search index, increasing the search index by the step size; otherwise, decreasing the search index by the step size; and (d) determining whether a single region containing the signal has been identified and, if so, determining this region to be the region within which the signal falls; otherwise, halving the step size and repeating steps (b)-(d).

Accordingly, a binary search may be implemented to efficiently determine the region into which the received signal falls. The region determined to be the region within which the signal falls is the region denoted by the search index (the region the spanning the search index) as, once a signal region has been identified, the search index should be a noninteger.

In one embodiment, a single region is identified when the number of times, k', the received signal has been compared to a boundary has reached $\log_2 L$, wherein L is the total number of regions. Alternatively, a single region is identified the search area is less than or equal to a single region.

In one embodiment, determining which region the signal falls within comprises:
(a) setting an area to be searched to comprise all of the regions;
(b) determining whether the signal falls within the largest half of the regions in the area to be searched;
(c) if the signal falls within the largest half of the regions of the area to be searched, assigning this half to be the area to be searched; otherwise, assigning the smallest half of the regions of the area to be searched to be the area to be searched; and
(d) determining whether a single region has been reached and, if so, assigning this region as the determined region for the signal; otherwise, repeating steps (b)-(d).

In one embodiment, the received signal is Gray-coded according to a predefined set of symbols, each symbol having its own assigned signal value, $a_i$. The boundaries are located at signal values described by the union of:

$$\left\{\pm \frac{a_i + a_{i+1}}{2}\right\}, i = 1, \ldots, \frac{M}{2} - 1;$$

$$\left\{\pm \frac{a_{(4k+1)2^{m-i}} + a_{(4k+3)2^{m-i}+1}}{2}, 0\right\},$$
$k = 0, \ldots, 2^{i-3} - 1, i = 3, \ldots, m;$ and $$\left\{\pm \frac{a_{(4k+3)2^{m-i}} + a_{(4k+5)2^{m-i}+1}}{2}\right\},$$
$k = 0, \ldots, 2^{i-3} - 2, i = 4, \ldots, m,$ wherein M is the total number of symbols and m is the number of bits assigned to each symbol.

According to one embodiment, the boundaries are assigned to signal values at which the LLR value for a bit reverses its sign. The signal value is the amplitude of the signal. The amplitude may be positive or negative. The LLR value reverses sign when it crosses zero. In other words, regions are assigned to signal values over which the signs of the LLR values stay the same. This allows the number of regions to be reduced to speed up demodulation.

In one embodiment, the linear function for each bit within each region may be a linear approximation of the LLR for that bit. The linear approximation for each region may be obtained by minimising the weighted squared error in the region. This allows a linear function to be estimated for the LLR within one of the approximated linear regions even if the LLR function within said region is actually piecewise linear.

According to a further embodiment there is provided a method of demodulating a pulse amplitude modulated, hereinafter referred to as PAM, signal, the method being performed in a device comprising a controller and a memory, the memory storing a set of boundaries of regions in which the log likelihood ratio, hereinafter referred to as LLR, for each bit to be determined is represented by a linear function of the received signal, along with the properties of the linear function for each bit for each region. The method comprises: receiving a PAM signal to be demodulated; determining which region the signal falls within; for each bit to be determined, retrieving the properties of the linear function for the LLR for the bit within the determined region and determining, from this linear function, the LLR value for the bit; and demodulating the signal based on the determined LLR values.

According to an embodiment, the received signal is Gray coded according to a predefined set of symbols, each symbol having its own assigned signal value. The properties of the linear function for each region comprise the gradient and the y-intercept of the linear function within the region. The gradient, $\alpha_i$, and y-intercept, $\beta_i$, for the $i^{th}$ bit for each region obey the following equations:

$$\alpha_i = 2(x_1^{(i)} - x_0^{(i)}); \text{ and}$$

$$\beta_i = (x_0^{(i)})^2 - (x_1^{(i)})^2,$$

wherein $x_0^{(i)}$ and $x_1^{(i)}$ are signal values assigned to the closest symbols to the region out of the symbols in which the $i^{th}$ bit equals 0 and 1 respectively.

According to an embodiment, determining the LLR value for each bit comprises calculating:

$$LLR_i = \frac{\alpha_i y + \beta_i}{\sigma^2}$$

wherein $LLR_i$ is the log likelihood ratio for the $i^{th}$ bit, $\alpha_i$ is the gradient for the $i^{th}$ bit, $\beta_i$ is the y-intercept for the $i^{th}$ bit, y is the received signal and $\sigma$ is a noise variance for the signal.

According to an embodiment, determining which region the signal falls within comprises:
(a) ordering the set of boundaries according size, setting a search index to identify a middle boundary of the set of boundaries and setting an initial step size of a quarter of the total number of regions;
(b) determining whether the received signal is greater than the boundary identified by the search index;
(c) if the signal is greater than the boundary identified by the search index, increasing the search index by the step size; otherwise, decreasing the search index by the step size; and
(d) determining whether a single region containing the signal has been identified and, if so, determining this region to be the region within which the signal falls; otherwise, halving the step size and repeating steps (b)-(d).

According to an embodiment, a single region is identified when the number of times, k', the received signal has been compared to a boundary has reached $\log_2 L$, wherein L is the total number of regions.

According to an embodiment, the received signal is Gray-coded according to a predefined set of symbols, each symbol having its own assigned signal value, $\alpha_i$, and wherein the boundaries are located at signal values denoted by:

$$\left\{\pm\frac{a_i+a_{i+1}}{2}\right\}, i=1,\ldots,\frac{M}{2}-1;$$

$$\left\{\pm\frac{a_{(4k+1)2^{m-i}}+a_{(4k+3)2^{m-i+1}}}{2},0\right\},$$

$$k=0,\ldots,2^{i-3}-1, i=3,\ldots,m;\text{ and}$$

$$\left\{\pm\frac{a_{(4k+3)2^{m-i}}+a_{(4k+5)2^{m-i+1}}}{2}\right\},$$

$$k=0,\ldots,2^{i-3}-2, i=4,\ldots,m,$$

wherein M is the total number of symbols and m is the number of bits assigned to each symbol.

According to an embodiment, the boundaries are assigned to signal values at which the LLR value for a bit reverses its sign.

According to an embodiment there is provided a non-transient computer readable medium containing program instructions for causing a computer to perform any of the methods described herein.

As described above, the max-log LLR is computed by finding the distances to the nearest symbols with a 0 and 1, respectively, in a particular bit position. Usually a QAM constellation is created by combining two pulse amplitude modulation (PAM) constellations for the in-phase (real) and quadrature (imaginary) signals. With such a constellation, the LLRs can be computed separately for the two components.

The following description assumes a separable QAM constellation and only shows how the LLRs are computed for a one-dimensional PAM constellation. Accordingly, only real-valued signals are dealt with. The extensions to separable QAM constellations and complex signals are straightforward and have therefore not been discussed in detail herein.

The max-log LLR functions for a uniform PAM constellation may be derived as piecewise linear functions. If a nonuniform PAM constellation is used, the LLR functions are still piecewise linear. Assuming that the received signal is in a region Y where the nearest symbols in the max-log expression are always the same $$x_0^{(i)} = \arg\min_{x \in X_0^{(i)}}(y-x)^2, \forall y \in Y \quad [3]$$

$$x_1^{(i)} = \arg\min_{x \in X_1^{(i)}}(y-x)^2, \forall y \in Y$$

wherein $x_0^{(i)}$ and $x_1^{(i)}$ (are values assigned to the closest symbols to the region out of the symbols in which the $i^{th}$ bit equals 0 and 1 respectively.

The LLR for bit i is then $$LLR_i(y) = \frac{1}{\sigma^2}\left((y-x_0^{(i)})^2 - (y-x_1^{(i)})^2\right) \quad [4]$$

$$= \frac{1}{\sigma^2}\left(2(x_1^{(i)} - x_0^{(i)})y + (x_0^{(i)})^2 - (x_1^{(i)})^2\right), \forall y \in Y$$

This is clearly a linear function in y. The noise variance $\sigma^2$ is a common scaling factor to all LLRs and can be applied after the distance difference has been computed. Note that the above expression is independent of which PAM constellation is used as it only states that within each linear region Y, the LLRs are linear functions of the received signal.

Accordingly, within each region, the LLR may be represented by a linear function. The gradient (slope) and offset (y-intercept) for each linear function may be calculated ahead of demodulation and stored, for instance, in a lookup table. The table should be populated with the linear function parameters (slope and offset) for each linear region. These can be found via the following method. For each linear region, pick any point, e.g., the midpoint between the two boundaries. Then find the nearest symbols, $x_0^{(i)}$ and $x_1^{(i)}$, in the subsets, $X_0^{(i)}$ and $X_1^{(i)}$ (the subset of symbols where the $i^{th}$ bit equals "0", and the subset of symbols where the $i^{th}$ bit equals "1") and compute the slope, $\alpha_i$, and offset, $\beta_i$, for each bit (i=1, ..., log$_2$ M). As can be seen from equation [4], the linear function parameters are $$\alpha_i = 2(x_1^{(i)} - x_0^{(i)})$$

$$\beta_i = (x_0^{(i)})^2 - (x_1^{(i)})^2 \quad [5]$$

where $x_0^{(i)}$ is the signal value for the closest symbol where the ith bit equals 0 to the region, and $x_1^{(i)}$ is the signal value for the closest symbol where the ith bit equals 1 to the region. The linear function parameters are stored in memory so that they may be used to efficiently demodulate signals, as described below. Note that the linear function parameters need only be calculated once, so that they may be stored on the device ahead of demodulation. In one embodiment, the device for demodulating the signal does not calculate the linear function parameters itself, and instead the linear function parameters are calculated by an external device and then loaded onto the device for use in demodulation. In an alternative embodiment, the device for demodulating signals calculates the linear function parameters itself before storing the parameters in memory.

Given that the LLRs are linear functions within each linear region, embodiments provide an efficient means of demodulating received QAM signals. Accordingly, embodiments provide reduced complexity methods that can demodulate nonuniform signals without resorting to suboptimal performance. This allows nonuniform constellations to be used with an increased constellation size to improve bit rate (vs. smaller constellation sizes) and/or to provide shaping gain for larger constellation sizes.

FIG. 1 shows the LLR for each bit in a constellation plotted as a function of the received signal. The LLR functions shown are the max-log LLR functions of equation [4]. The constellation shown includes four bits per symbol. The constellation points are marked as "x". The LLR functions are linear within a set of linear regions. The boundaries of each linear region are denoted by dashed lines and by the points marked on each plot (circles for bit 1, squares for bit 2, diamonds for bit 3 and stars for bit 4). It can be seen that, within each linear region, each of the four LLR distributions can be described by a linear function. Accordingly, by storing the linear function parameters, embodiments provide an efficient means of calculating the LLR values for a received signal.

Embodiments compute LLRs in the following manner:
1. Determine into which region the received signal falls.
2. Find the linear function parameters (slope and offset) for all log$_2$ M bits for the symbol for that region from a lookup table.
3. Compute the LLRs using the above linear parameters and the received signal.

The LLR values are then output. The LLR values can subsequently be used to produce a set of demodulated bits from the signal (e.g. by assigning a value of "0" to any bits with negative LLRs and a value of "1" to any bits with positive LLRs). Accordingly, by predetermining the boundaries of the linear regions and the linear function parameters for the bits in these linear regions, embodiments provide an efficient means of demodulating QAM signals.

Figures 2A, 2B:
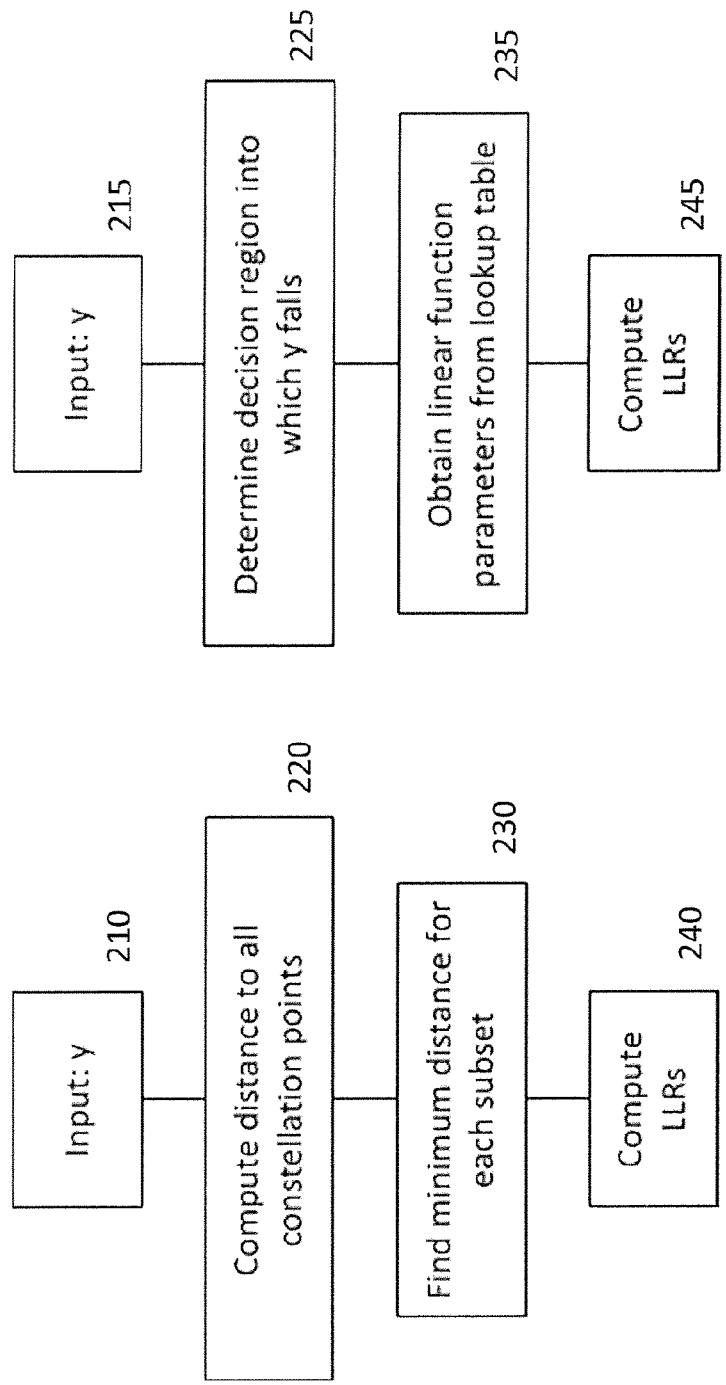
FIG. 2A shows a known method of computing the LLRs for a given signal y.
FIG. 2B shows an improved method of computing the LLRs for a given signal y in accordance with an embodiment.

FIG. 2A shows a known method of computing the LLRs for a given signal y. The received signal y is initially input 210. The distance between the received signal and each of the possible constellation points for each bit is then computed 220. Based on these distances, the minimum distance is determined 230 for each possible value (e.g. "0" or "1") for each bit. Based on these minimum distances, the LLR for each bit is calculated 240, for instance, using equation [2] above.

FIG. 2B shows an improved method of computing the LLRs for a given signal y in accordance with an embodiment. Again, the received signal y is initially input 215. This time the linear region into which y falls is determined 225 for each bit based on a predetermined set of boundaries. Based on this, the linear function parameters for the determined linear regions are determined 235 from a lookup table. These parameters include the gradients and y-intercepts of the linear functions for the LLRs for the linear region. The parameters are then used to calculate the LLR for each bit 245. The LLR for a given signal y within the linear region i having a linear function with a gradient of $\alpha_i$ and a y-intercept of $\beta_i$ is $$LLR_i = \frac{\alpha_i y + \beta_i}{\sigma^2} \qquad [6]$$

This provides a more efficient method of demodulating a nonuniform QAM signal as the method avoids calculating the distance to each and every possible symbol in the constellation.

Figure 3:
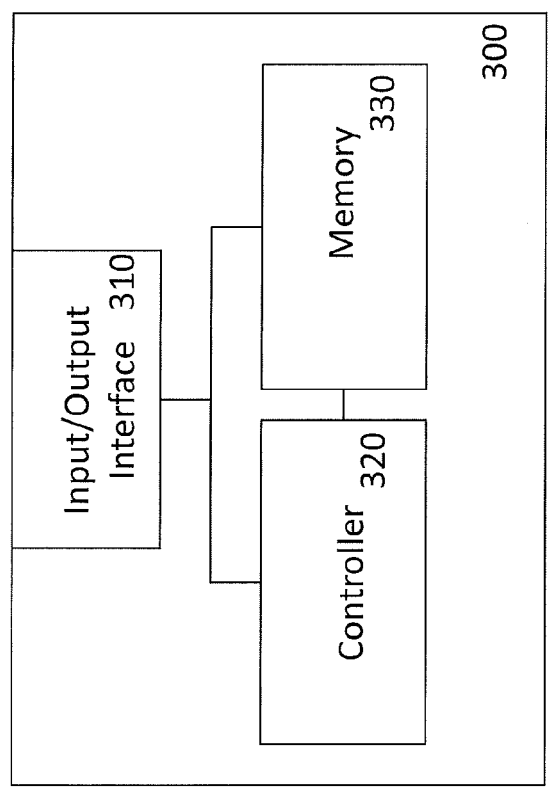
FIG. 3 shows a device for demodulating a received QAM signal in accordance with an embodiment.

FIG. 3 shows a device for demodulating a received QAM signal in accordance with an embodiment. The device 300 comprises an input/output interface 310 configured to receive the QAM signal. The device further comprises a controller 320 configured to demodulate the signal based on a predefined set of boundaries and linear function parameters stored in memory 330. The controller 320 is configured to demodulate the received signal and to output the LLR values for each bit in the signal. The output may be via the input/output interface 310, for instance, to a monitor or an external device. Alternatively the output may be to memory 330 for storage. Alternatively, the controller 320 may be further configured to decode the bits determined from the demodulation stage to determine the received message, which then may be output as discuss above.

As discussed above, the QAM signal can be split into two independent PAM signals. Accordingly, the controller 320 is configured to determine the value of the real and imaginary parts of the QAM signal and independently determine the LLR values for the bits for the symbol based on these two values. For simplicity, the following description relates to the demodulation of a signal PAM signal.

As mentioned above, the constellation boundaries may be predetermined. When a uniform PAM constellation is used, the boundaries are trivial; if the distance between two constellation points is 2d, they are 2kd, $$k = -\left(\frac{M}{2} - 1\right), \ldots, \frac{M}{2} - 1.$$

Note that there are M−1 boundaries and hence M regions.

For a nonuniform PAM constellation, the symbols are assigned values $\{\pm\alpha_1, \pm\alpha_2, \ldots, \pm\alpha_{M/2}\}$. From the above derivations, it can be seen that the boundaries are the midpoints between symbols in the sets $X_0^{(i)}$ and $X_1^{(i)}$. For a Gray-coded (nonuniform) constellation the boundaries can be found (see Appendix A) to be the union of the following three sets, where m=log$_2$ M:

$$\left\{\pm \frac{a_i + a_{i+1}}{2}\right\}, i = 1, \ldots, \frac{M}{2} - 1 \qquad [7.1]$$

$$\left\{\pm \frac{a_{(4k+1)2^{m-i}} + a_{(4k+3)2^{m-i}+1}}{2}, 0\right\}, \qquad [7.2]$$
$$k = 0, \ldots, 2^{i-3} - 1, i = 3, \ldots, m$$

$$\left\{\pm \frac{a_{(4k+3)2^{m-i}} + a_{(4k+5)2^{m-i}+1}}{2}\right\}, \qquad [7.3]$$
$$k = 0, \ldots, 2^{i-3} - 2, i = 4, \ldots, m$$

Note that, in the present embodiment, the nonuniform PAM symbols are assumed to be symmetric around zero. Whilst this makes sense from a communications point of view this is not essential and alternative embodiments employ nonuniform PAM symbols which are not symmetric around zero.

In addition, the present embodiment utilises Gray-coded constellations; however, alternative embodiments demodulate alternative constellations. In these embodiments, the boundaries would be calculated differently; however the main principle of the proposed method still holds true.

As discussed above, the boundaries are determined beforehand and are stored in memory along with the gradient and y-intercept for the linear functions for each bit in each linear region.

To determine which region the received signal falls into, a tree-like search is enacted. The boundaries are determined ahead of time and stored in memory in a sorted vector s= $(s_0, \ldots, s_{L-1})$, where $s_0 < s_1 < \ldots < s_{L-1}$ and L is the length (the number of linear regions. For a uniform constellation, the number of linear regions will equal the number of symbols M. For a nonuniform constellation, the number of linear regions will be greater than the number of symbols. Note that, by convention, $s_0 = -\infty$. For the boundaries derived above for a Gray-coded constellation, the length L≤2M−2 log$_2$ M.

The search takes the middle boundary and determines whether the signal is greater than this boundary (within a search region covering half of the possible linear regions). If the signal is greater than this boundary then the region above the middle boundary is searched by taking the middle boundary of this new region, otherwise, the region below the middle boundary is searched by taking the middle boundary of this other region. Accordingly, the search region is halved to a search a quarter of the available regions. The step region is then halved again and a new comparison is made, etc. This continues until the search region is equal to one and the last comparison is made. Accordingly, this method iteratively halves the search region and chooses the region within which the signal falls.

This means that the linear region can be found in ⌈log$_2$ L⌉≤⌈log$_2$(2M−2 log$_2$ M)⌉≤log$_2$ 2M=log$_2$ M+1 steps. Note that this assumes that L is a power of 2; if this is not the case, the last element $s_{L-1}$ may be replicated to pad the vector s so that L is made to be a power of 2. This is not essential however, and in an alternative embodiment the vector s is not padded. In this case, if L is not a power of 2, the binary search sometimes takes $\lfloor \log_2 L \rfloor$ steps and other times takes $\lceil \log_2 L \rceil$ steps.

Figure 4:
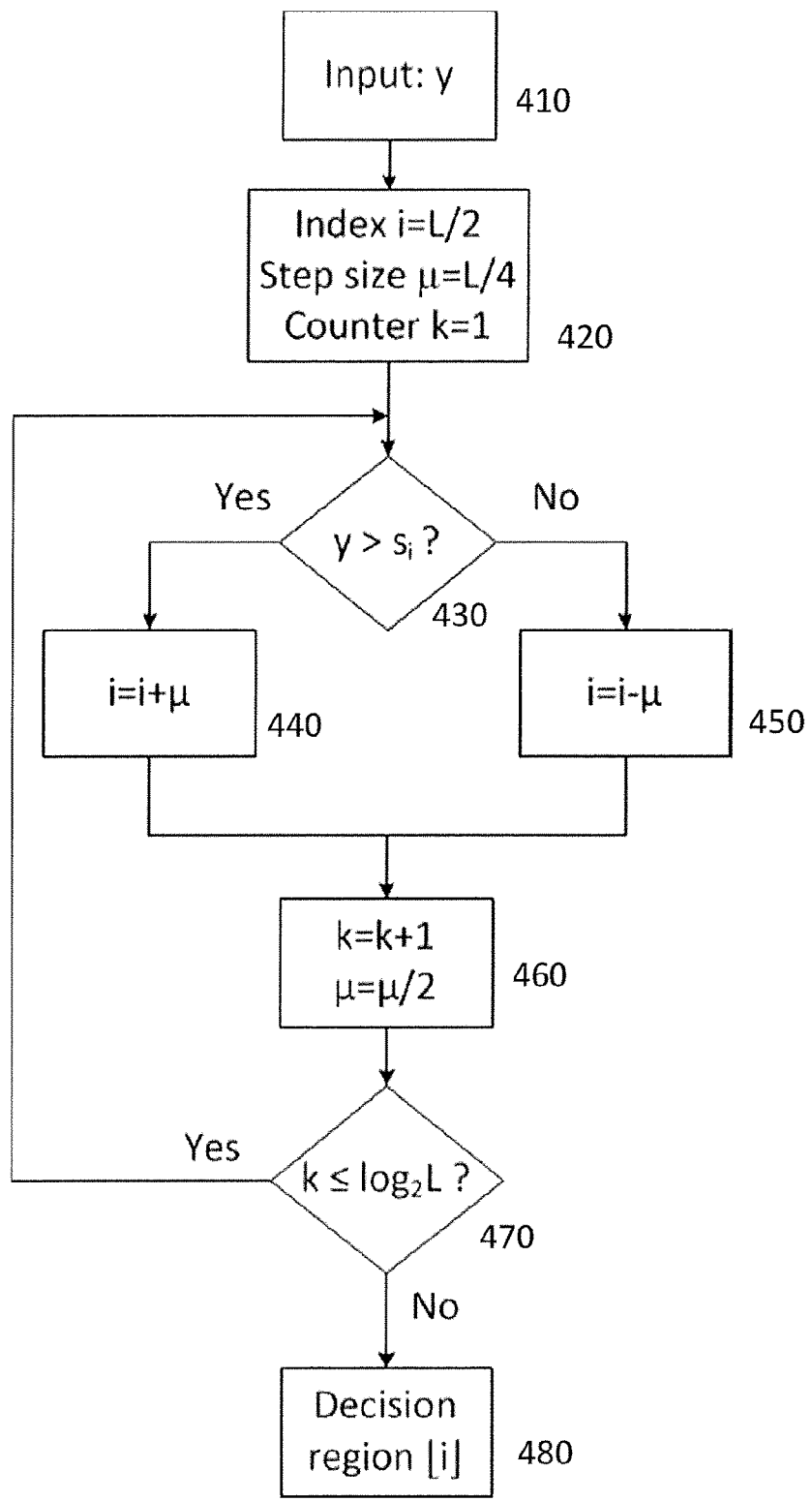
FIG. 4 shows a method of determining the linear region for a given input signal y according to an embodiment.

FIG. 4 shows a method of determining the linear region for a given input signal y according to an embodiment. The input signal y is first received 410. As discussed above, this may be the sine or cosine component of a separable QAM signal which has been separated before signal y is input. Alternatively, this may be a received PAM signal. The signal y is then compared with the middle boundary. In the present embodiment, as $s_0 = -\infty$ and L is a power of 2, the middle boundary is $s_{[L/2]}$. To compare the signal to this boundary, the system is first initialised 420. An index i is set to i=L/2 to identify the middle boundary. In addition, the step size μ is set to μ=L/4 and a counter k is initialised at k=1.

It is then determined 430 if the received signal is larger than the middle boundary $s_{[i]}=s_{[L/2]}$. If this is the case, then the search index i is increased 440 by the step size (i.e., i is set to i=i+μ=i+L/4), otherwise it is decreased 450 by the step size (i.e. i is set to i=i−μ=i−L/4).

The counter k and the step size are then updated 460. The counter is increased by one, k=k+1, whilst the step size is halved, μ=μ/2. It is then determined if the last step has been reached 470 by determining whether k≤$\log_2$ L. If k≤$\log_2$ L, then steps 430-470 are repeated to determine whether the signal is greater or less than a new boundary set by the updated index and corresponding to a new midpoint. The method repeats until the last step has been reached, i.e. until k>$\log_2$ L. At this point, the linear region is set 480 to be the region having a lower boundary denoted by the index when rounded down to the nearest integer ($\lfloor i \rfloor$). That is, the index is rounded down to the nearest integer to find the lower boundary of the linear region ($s_{\lfloor i \rfloor}$). The upper boundary of the linear region will then be the next boundary above the lower boundary ($s_{\lfloor i \rfloor+1}$). This is therefore the $\lfloor i \rfloor^{th}$ linear region.

Once the linear region has be found, the slope $\alpha_i$ and offset $\beta_i$ are read from the lookup table, and the LLRs for this region are computed as $$LLR_i = \frac{\alpha_i y + \beta_i}{\sigma^2} \quad [8]$$

Where the received signal is a QAM signal, real and imaginary components will be determined from the QAM signal, and each will be treated as an independent PAM signal. The linear region for each of the PAM signals is determined. LLR values will be calculated according to these linear regions for each bit relevant to each PAM signal. As mentioned above, some of the bits will vary along the imaginary axis of the constellation diagram, whilst some of the bits will vary along the real axis. Accordingly, for each PAM signal, the LLR values will be calculated only for the bits which vary along the relevant axis for that component. The LLR values calculated for each PAM signal can then be combined to determine the whole of the demodulated signal.

This embodiment provides an efficient means of demodulating a nonuniform QAM signal by using precalculated values for the gradient and y-intercept of a linear approximation of the LLR function within predefined linear regions.

As an alternative embodiment, step 470 is replaced by a determination of whether the step size is greater than or equal to 1. If it is, then the method repeats steps 430-470. If not, then the linear region is output 480 as determined above.

Instead of computing the LLR by calculating the distances to the constellation points and then finding the minimum over the subsets $X_0^{(i)}$ and $X_1^{(i)}$, embodiments find the linear region, read the linear function parameters from a lookup table and then compute the LLRs for each bit.

This method can compute the LLRs for nonuniform QAM constellations with complexity of the order of $\log_2$ M as opposed to an order of M for the exhaustive search. This can represent a significant saving, especially for systems with large constellations.

To show how the method would work, the example of 16-PAM is considered. In this case, the number of symbols in the constellation, M, is 16, and the number of bits per symbol is m=$\log_2$ M=$\log_2$ 16=4. The (nonuniform) constellation points in the present example are $$\{\alpha_i\}_{i=1}^8 = \{0.057, 0.174, 0.295, 0.426, 0.571, 0.743, 0.969, 1.37\}$$

and, according to equations 7.1, 7.2 and 7.3, the boundaries are the union of the three subsets:

$$\left\{\pm \frac{a_1 + a_2}{2}, \pm \frac{a_2 + a_3}{2}, \pm \frac{a_3 + a_4}{2}, \right. \quad [9]$$
$$\left. \pm \frac{a_4 + a_5}{2}, \pm \frac{a_5 + a_6}{2}, \pm \frac{a_6 + a_7}{2}, \pm \frac{a_7 + a_8}{2}\right\}$$
$$\cup \left\{\pm \frac{a_2 + a_7}{2}, \pm \frac{a_1 + a_4}{2}, \pm \frac{a_5 + a_8}{2}, 0\right\} \cup \left\{\pm \frac{a_3 + a_6}{2}\right\}$$

Figure 5:
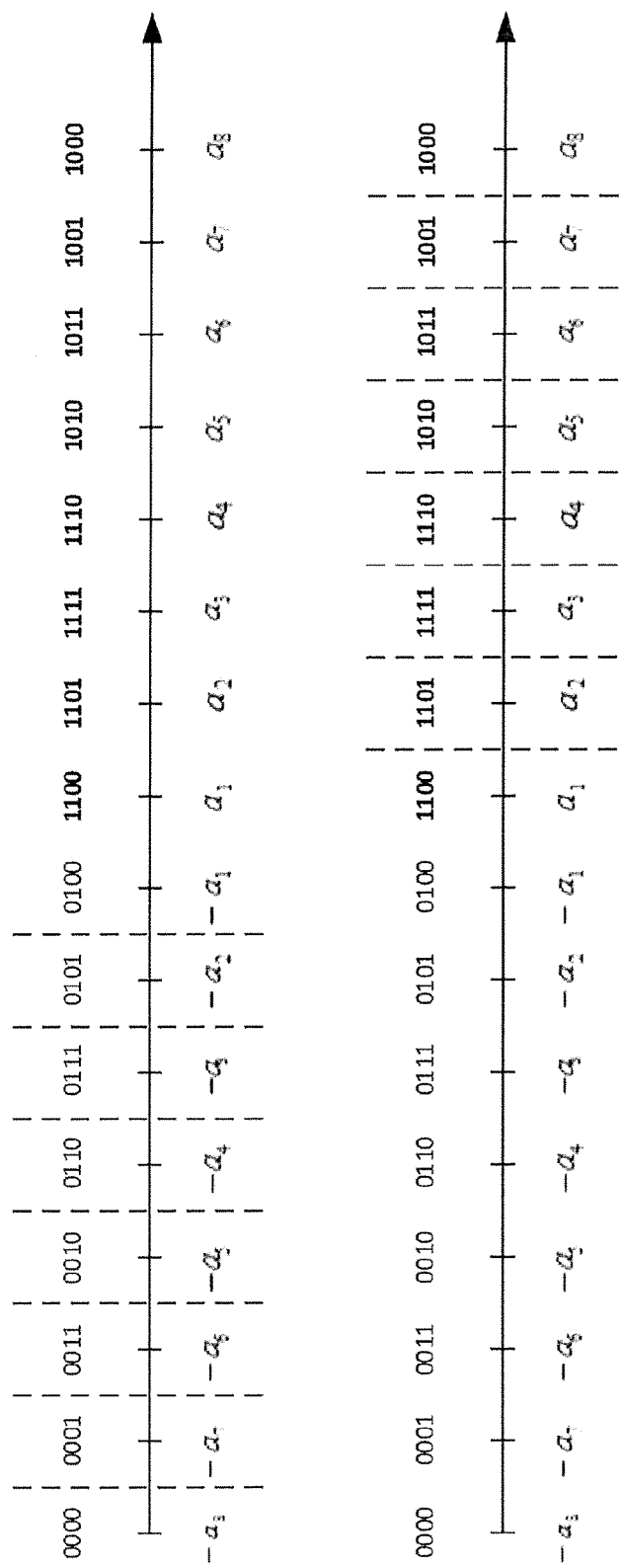
FIG. 5 shows the region boundaries for the first bit of a Gray coded four-bit PAM constellation.

FIG. 5 shows the boundaries for the first bit of a Gray coded four-bit PAM constellation. As the symbols are Gray coded, adjacent symbols vary from each other by only one bit. The boundaries for $b_1=0$ are shown on the top graph and those for $b_1=1$ are shown on the bottom graph. The symbols with their first bit equalling 0 ($X_0^{(1)}$) and their first bit equalling 1 ($X_1^{(1)}$) are shown in non-bold and bold respectively. The boundaries between the symbols are represented by dashed lines. The boundaries separate the symbols where the first bit equals 0 (top graph) and 1 (bottom graph). All the boundaries shown in FIG. 5 are contained in first set of boundaries shown above.

Figure 6:
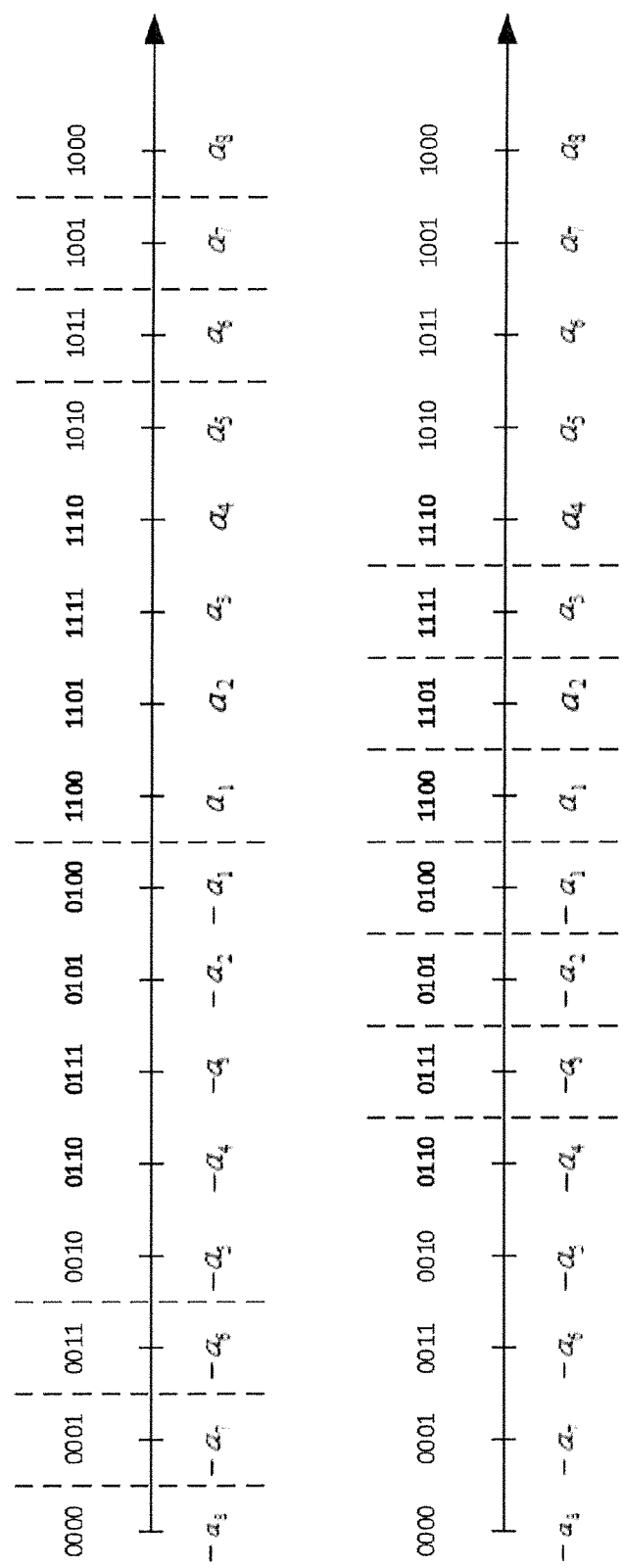
FIG. 6 shows the region boundaries for the second bit of a Gray coded four-bit PAM constellation.

FIG. 6 shows the boundaries for the second bit of a Gray coded four-bit PAM constellation. The boundaries for $b_2=0$ are shown on the top graph and those for $b_2=1$ are shown on the bottom graph. The boundaries are all in the first subset except for the boundary at zero.

Figure 7:
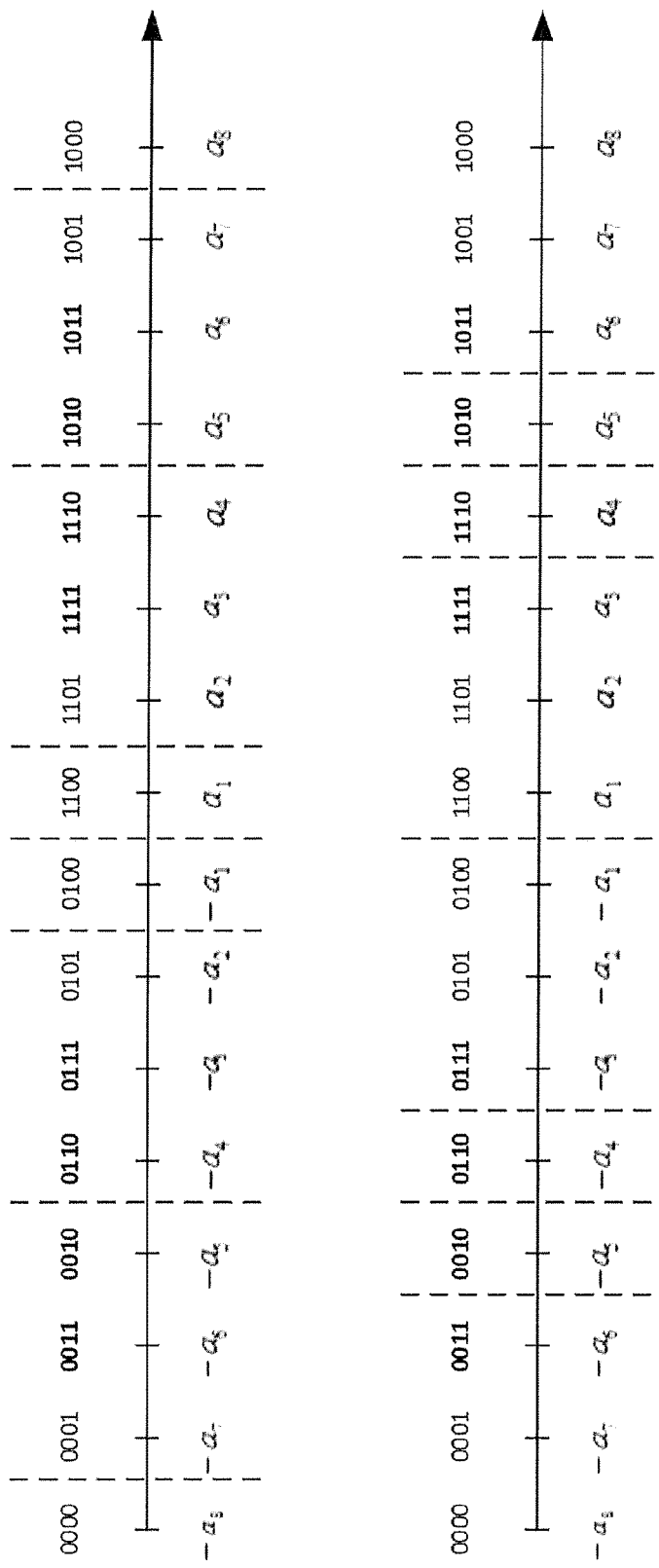
FIG. 7 shows the region boundaries for the third bit of a Gray coded four-bit PAM constellation.

FIG. 7 shows the boundaries for the third bit of a Gray coded four-bit PAM constellation. The boundaries for $b_3=0$ are shown on the top graph and those for $b_3=1$ are shown on the bottom graph. The boundaries are all in the first subset except for $$\pm \frac{a_2 + a_7}{2}$$

(shown in the top graph as the boundaries separating $\pm \alpha_4$ from $\pm \alpha_5$).

Figure 8:
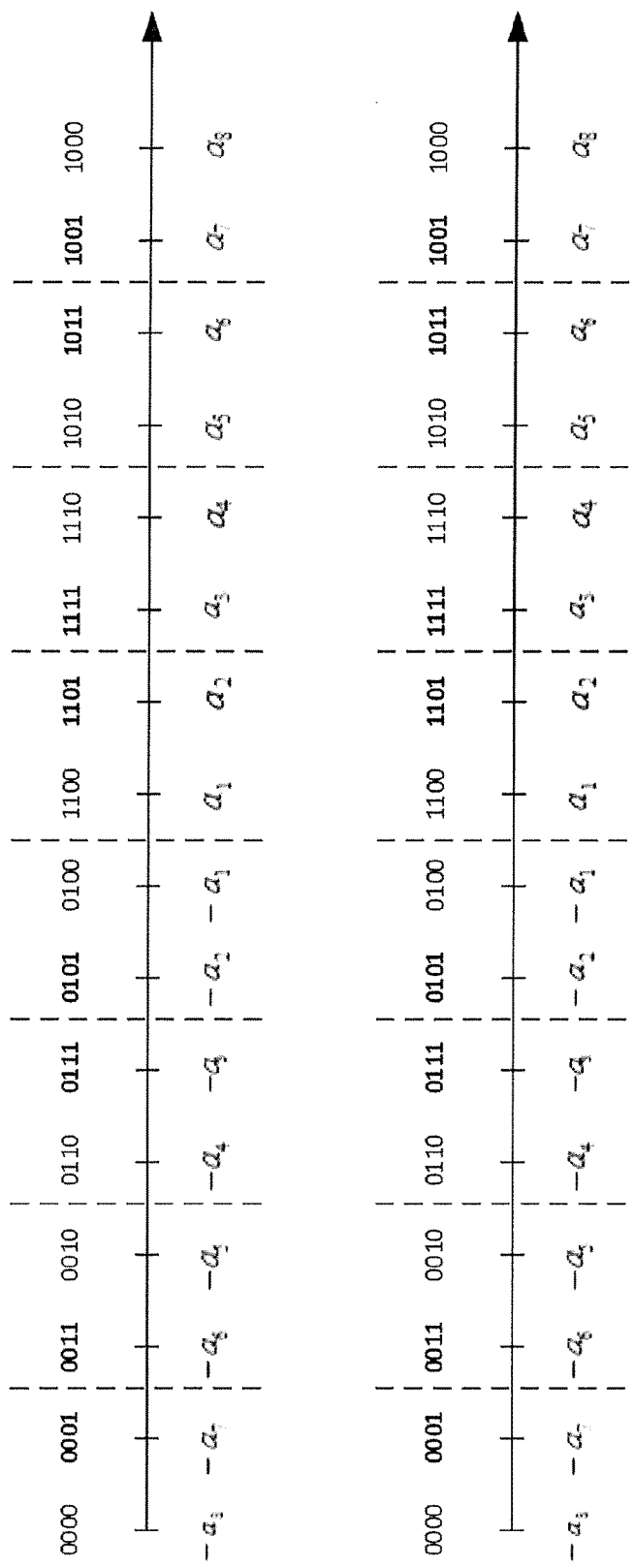
FIG. 8 shows the region boundaries for the fourth bit of a Gray coded four-bit PAM constellation.

FIG. 8 shows the boundaries for the fourth bit of a Gray coded four-bit PAM constellation. The boundaries for $b_4=0$ are shown on the top graph and those for $b_4=1$ are shown on the bottom graph. The boundaries are all in the first set except for $$\pm \frac{a_1 + a_4}{2}, \pm \frac{a_5 + a_8}{2}$$

(shown in the top graph as the boundaries separating $\pm\alpha_6$ from $\pm\alpha_7$) and $$\pm \frac{a_3 + a_6}{2}$$

(shown in the bottom graph as the boundaries separating $\pm\alpha_4$ from $\pm\alpha_5$).

It is clear that the second subset contains the boundaries for bit value 0 that are not already in the first subset; the same is true for the third subset which contains the boundaries for bit value 1 that are not already in the first subset.

It should be noted that, in FIGS. 5-8 the symbols are spaced equally for clarity. Accordingly, the boundaries of the second and third subset are appear to be present in the first subset $$\left(\text{e.g.,} \pm \frac{a_2 + a_7}{2} = \pm \frac{a_4 + a_5}{2}\right).$$

Having said this, for nonuniform constellations, these boundaries may be different.

In the present example, the boundaries, calculated via equations 7.1, 7.2 and 7.3 and sorted from low to high, are:

$S = \{-\infty, -1.171, -0.971, -0.857, -0.658, -0.573,$
$-0.520, -0.499, -0.362, -0.242, -0.236, -0.117,$
$0, 0.117, 0.236, 0.242, 0.362, 0.499, 0.520,$
$0.573, 0.658, 0.857, 0.971, 1.171, \infty\}$ Note that, by default, $s_0 = -\infty$ and $s_L = \infty$.

These boundaries define L regions, $Y_l = \{y: s_l \leq y < s_{l+1}\}$, $l = 0, \ldots, L$. That is, the first region is $s_0 \leq y < s_1$, the second region is $s_1 \leq y < s_2$ and so on.

The LLRs as functions of signal strength, the boundaries and the constellation points are shown in FIG. 1. As can be seen, the LLRs are a linear function of the received signal in each linear region.

If the received signal is y=0.581, the search for the region would be as follows. Since $|S|=L=24$, the vector s is initially padded with 9 copies of $s_{23}$ to make it length $L=32=2^5$. The method begins with index $$i = \frac{L}{2} = 16$$

and step size $\mu=L/4=8$. $\log_2 L=5$ comparisons (loops in FIG. 4) must be made before the final linear region can be determined.

In the first pass, $y > s_{16}$ as 0.581>0.362. Accordingly, the step size, $\mu$, is added to the index (i.e. i←16+8=24) and the step size is halved (i.e. $\mu$←8/2=4).

In the second pass, $y \leq s_{24}$ as 0.581≤1.171. Accordingly, the step size, $\mu$, is subtracted from the index (i.e. i←24−4=20) and the step size is halved (i.e. $\mu$←4/2=2).

In the third pass, $y \leq s_{20}$ as 0.581≤0.658. Accordingly, the step size, $\mu$, is subtracted from the index (i.e. i←20−2=18) and the step size is halved (i.e. $\mu$←2/2=1).

In the fourth pass, $y > s_{18}$ as 0.581>0.520. Accordingly, the step size, $\mu$, is added to the index (i.e. i←18+1=19) and the step size is halved (i.e. $\mu$←½=0.5).

In the fifth pass, $y > s_{19}$ as 0.581>0.573. Accordingly, the step size, $\mu$, is added to the index (i.e. i←19+0.5=19.5) and the step size is halved (i.e. $\mu$←0.5/2=0.25).

As the fifth loop has been reached (i.e. $k=6>\log_2 L=5$), the system determines the linear region denoted by the current index to be the linear region for the signal. That is, the linear region is determined to be the region spanning the current index, beginning with the boundary just below the current index and ending at the boundary just above the current index. In this case, [i]=[20.5]=20. This means that the region spans from $s_{20}=0.573$ to $s_{21}=0.658$. A simple comparison shows that this is the correct region that contains the received signal value y=0.581.

The limit in step 470 may equally be determining whether k'<$\log_2$ L wherein k' is the number of times the received signal y has been compared to a boundary. In this case, the counter k' would be initialised at 0 in step 420. These two methods are effectively equivalent.

For the known LLR method M distances must be computed, $$2\left(\frac{M}{2} - 1\right)$$

comparisons for each of the $\log_2$ M bits must be made and the minimum distances must be subtracted. This means M multiplications, M+$\log_2$ M additions and (M−2) $\log_2$ M comparisons. In contrast, the present embodiment requires (at most) $\log_2$ M multiplications, $\log_2$ M additions, 1+$\log_2$ M comparisons and 2 $\log_2$ M table lookups. It is clear that the known method has complexity of order 0(M) whereas the present embodiment has 0($\log_2$ M). Accordingly, the present embodiment provides a more efficient means of demodulating PAM and QAM signals.

Figure 9:
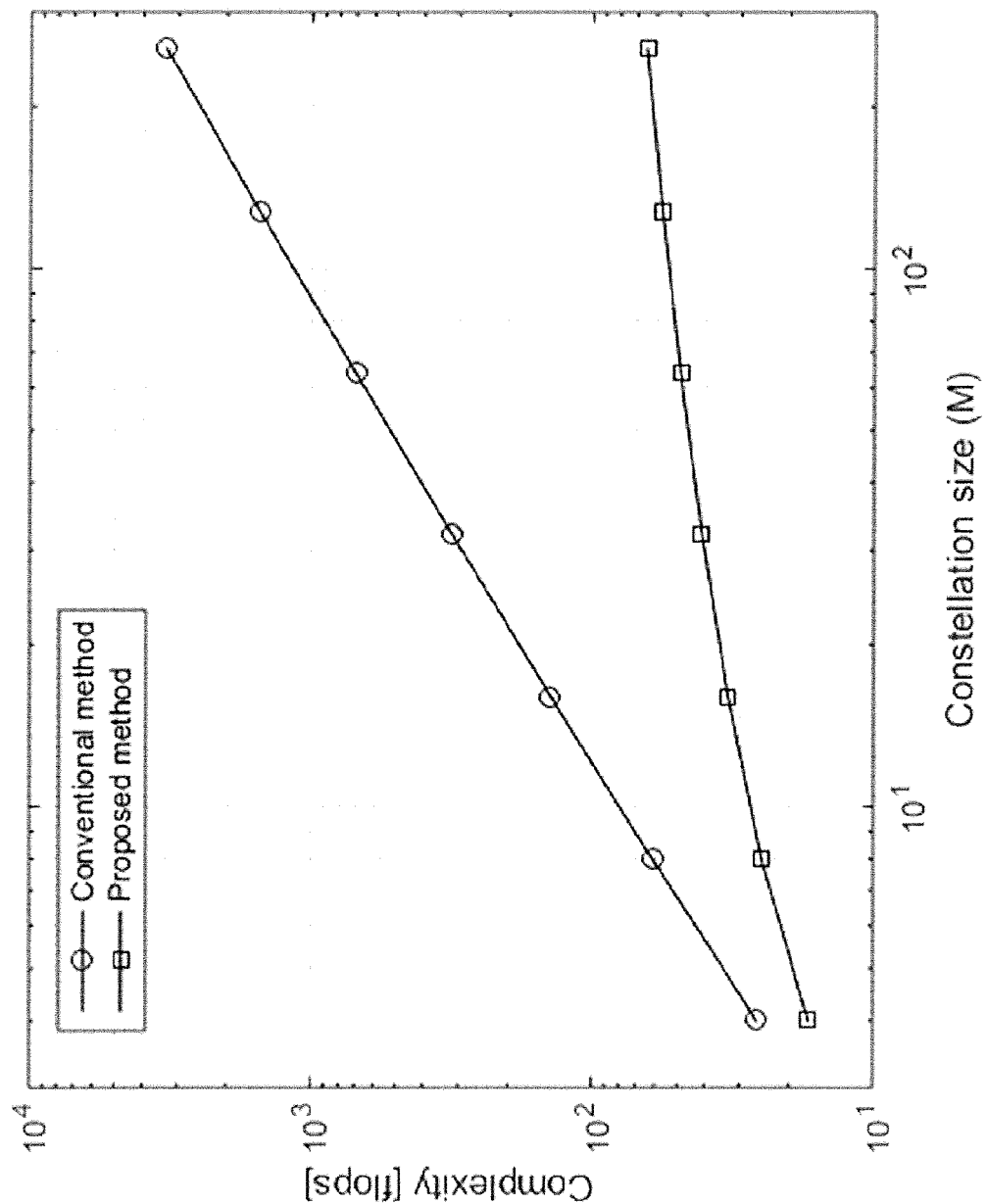
FIG. 9 shows a complexity comparison between a known demodulation method and the present embodiment.

FIG. 9 shows a complexity comparison between the known demodulation method and the present embodiment. In this comparison, it is assumed that all operations take one flop except for multiplication which requires four. It can be seen that the present embodiment (plotted as squares) is much more efficient that the known method (plotted as circles), with a greater performance increase being provided as the size of the constellation increases.

It is also possible to approximate the max-log LLR to reduce the complexity further. From FIG. 1 it can be seen that some linear regions are very small and these may be excluded; this will reduce the complexity accordingly. The new linear regions can be formed in many ways. In one embodiment the intervals where the LLRs do not change signs are utilised. The sign of the LLR corresponds to a hard decision between "0" and "1", and hence for an approximation to be accurate, it makes sense that the same hard decision as the exact max-log LLR is used.

In one embodiment, all intervals or regions in which the sign of the max-log LLR stays the same are found. Within these intervals the LLR is approximated as a linear function. Note that the max-log LLR may be piecewise linear in some of these intervals, i.e., the LLR may not be a linear function within these approximated regions, as in the previous embodiment. Accordingly, it may be necessary to approximate the max-log LLR function within such regions. In one embodiment, the best linear approximation for an approximated region (the kth region) is found by determining the values of the gradient, $\alpha$, and the y-intercept, $\beta$, that minimise the weighted squared error in the region $$\int_{\hat{s}_k}^{\hat{s}_{k+1}} (\alpha_k^{(i)} y + \beta_k^{(i)} - L(y))^2 p_Y(y) dy \qquad [10]$$

where L(y) is the max-log LLR of equation [4], $\hat{s}_k$ and $\hat{s}_{k+1}$ are the boundaries of the approximated region and $p_Y(y)$ is the probability density function (PDF) of the received signal $$p_Y(y) = \sum_k e^{-(y-x_k)^2/\sigma^2} \qquad [11]$$

This weighting function is the (scaled) probability density function for the received signal, where $x_k$ are the constellation points and $\sigma^2$ is the noise variance. Whilst the latter is not known when the look-up table is calculated offline (in advance of receiving any signals), it is fairly straightforward to choose a value in the likely operating range and keep it fixed.

For the above example, the new approximated boundaries would then be:

$\hat{S}$={−∞, −1.170, −0.856, −0.657, −0.499, −0.361,
−0.235, −0.116, 0, 0.116, 0.235, 0.361, 0.499,
0.657, 0.856, 1.170, ∞}.

Figure 10:
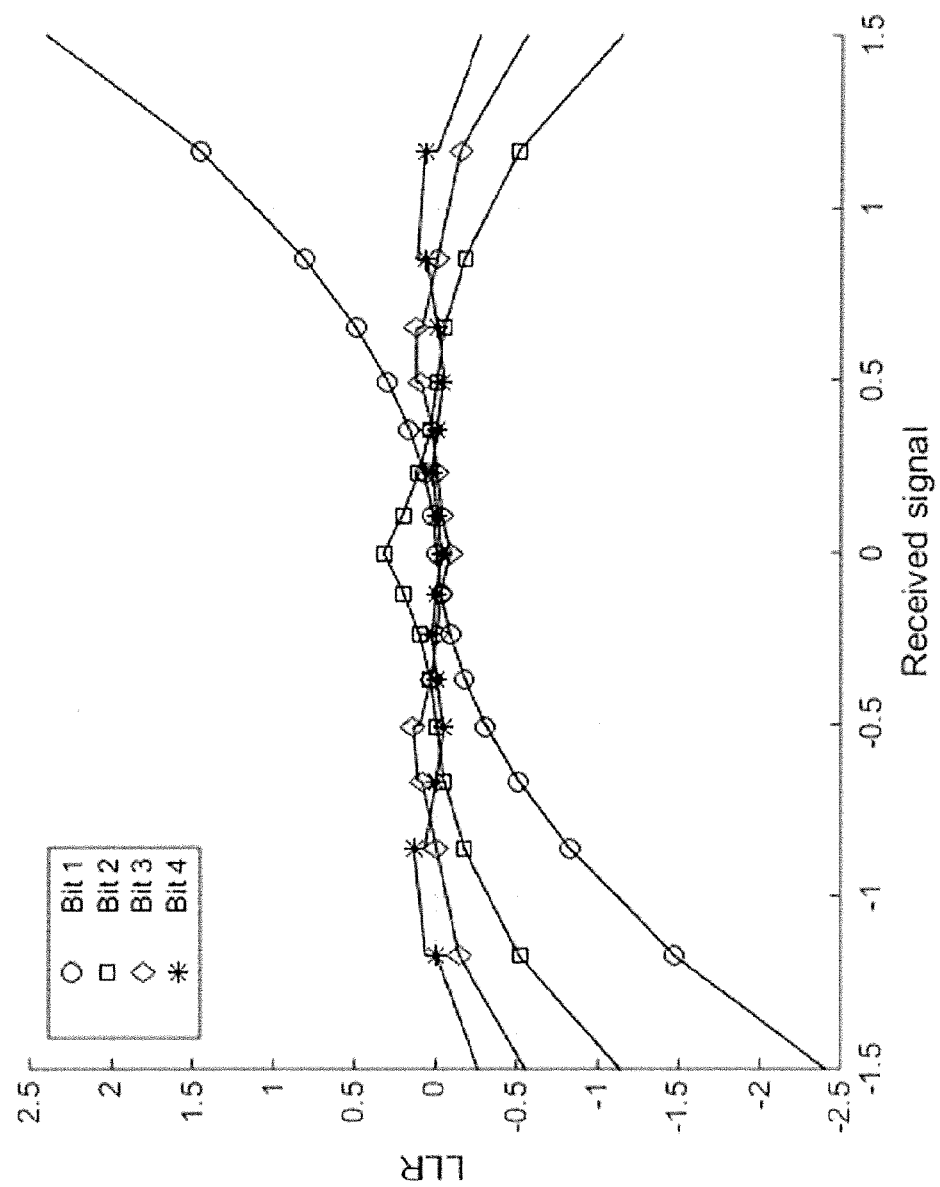
FIG. 10 shows approximated region boundaries for each bit in accordance with an embodiment.

FIG. 10 shows the approximated boundaries for each bit in accordance with an embodiment. As with FIG. 1, the LLR is plotted for each bit as a function of the received signal. The approximated boundaries are represented by the points on each function (circles for bit 1, squares for bit 2, diamonds for bit 3 and stars for bit 4). As discussed above, the boundaries are set to equal the signal strength at which at least one of the LLR functions changes sign. That is, the boundaries are set to the signal values at which the LLR for at least one of the bits changes from positive to negative or from negative to positive (crosses "0").

From FIG. 10 it can be seen that this approximation reduces the number of boundaries by removing the smaller linear regions that are shown in FIG. 1. Note that there are only 16 boundaries compared to the 25 for the unapproximated embodiment shown in FIG. 1. In general there are M intervals, which is almost half compared to the 2M−2 $\log_2$ M intervals of FIG. 1.

The LLR functions for each bit have also been approximated by minimising the weighted squared error within the respective regions, as discussed above. For instance, the LLR for the fourth bit within the second region in FIG. 10 (spanning from −1.170 to −0.856) is now linear, as opposed to the function shown in FIG. 1 in which a peak is formed between two linear functions in the equivalent area. Whilst this approximation results in different values from the exact LLR function, the accuracy decrease is minimal compared to the efficiency increase.

Figure 11:
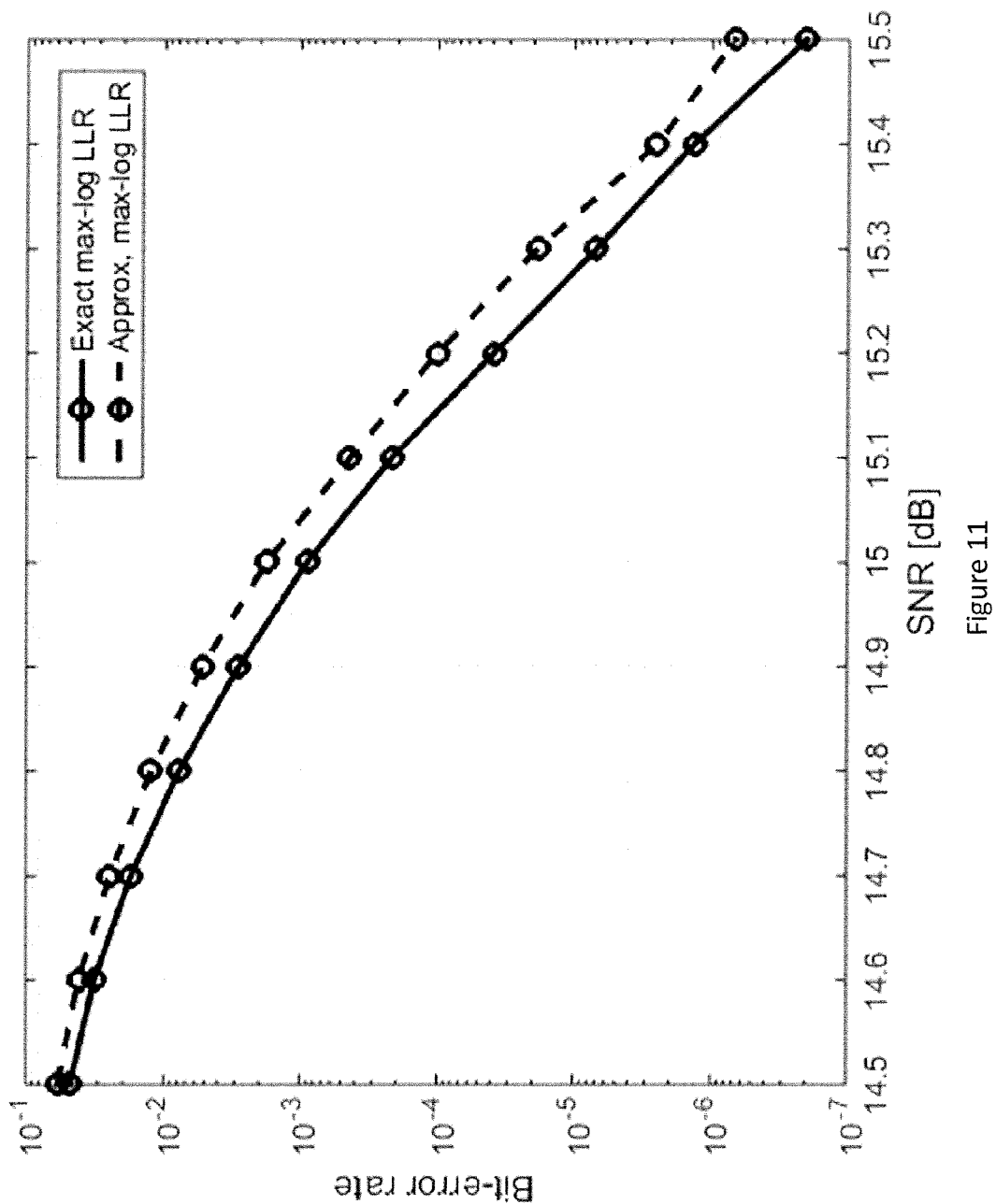
FIG. 11 shows the bit error rate (BER) of a turbo-coded system (5000 bits, rate ½ with the 3GPP codec (3GPP, 2014)) for the exact and approximated max-log LLR.

FIG. 11 shows the bit error rate (BER) of a turbo-coded system (5000 bits, rate ½ with the 3GPP codec (3GPP, 2014)) for the exact and approximated max-log LLR embodiments. As can be seen, there is only a degradation of around 0.05 dB when using the present approximation. Accordingly, the approximation of this embodiment offers a more efficient method of demodulating a QAM signal with only a small degradation in system performance.

As described above, embodiments implement the demodulation methods described herein in a device, such as that shown in FIG. 3. Signals to be demodulated are received by the input/output interface 310 and demodulated by the controller 320 using boundaries and linear function parameters stored in the memory 330. The boundaries and linear function parameters may be loaded onto the system (i.e. may be calculated by an external device) or may be calculated by the controller 320 and stored in memory 330 for future use.

The demodulation produces a set of bits from the received signal along with a set of log likelihood ratios indicating the confidence related to each bit. Where the signal has been coded (for instance, according to an error correction code), the demodulated bits may be output to a decoder (or the controller may be further configured to decode the bits). This decoding may utilise the LLR values for each bit to correct for any errors that may have arisen during the transmission of the signal. This decoded signal may be fed back into the demodulator to improve the demodulating and decoding estimates.

The bits determined from the demodulation (and, if enacted in the controller, the decoding) may be output via the input/output interface 310, for instance, to a monitor or another device (e.g. via a network). Alternatively, the bits may be output by the controller 320 to memory 330 to be stored for future use. Alternatively, the bits may be utilised by the controller 320 in one or more further processes.

The embodiments described herein may be implemented in a device with any form of controller or processor capable of enacting the processing described herein. The invention is not limited to the specific embodiments described herein. Accordingly, any controller may be implemented, including one operating according to software stored in the device or one operating completely according to specifically designed hardware.

While certain embodiments have been described, the embodiments have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

APPENDIX A

For a uniform constellation, the regions are simple to find as they are multiples of the distance between two neighbouring points; however, for a nonuniform constellation, the boundaries between the regions will be irregular. The can however be derived when a Gray mapping is used.

Figure 12:
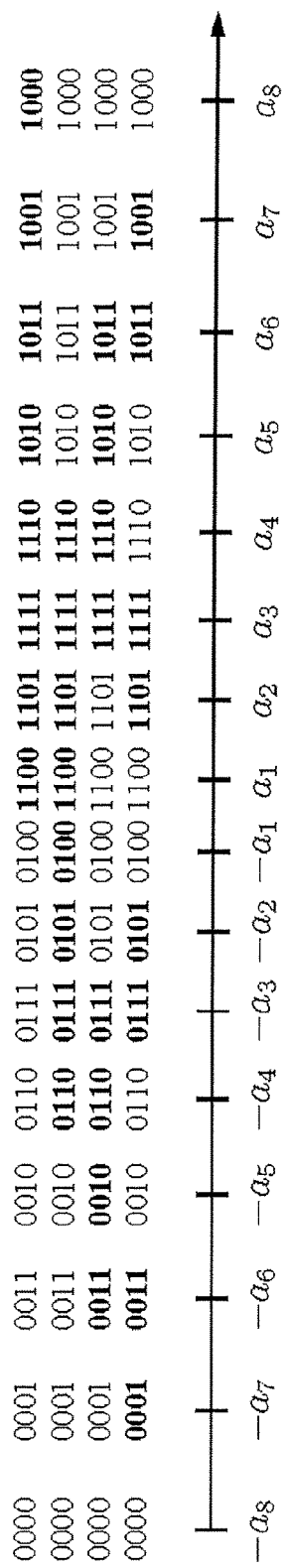
FIG. 12 shows the bit representation of a PAM constellation with M=16.

FIG. 12 shows the bit representation of a PAM constellation with M=16. The ith row corresponds to the binary quadruples of the M symbols for the ith bit position, where a bit value of one ($b_i$=1) is indicated in bold face.

We will now show that the boundaries (and hence the regions) for the LLR calculation is the union of three sets, $S_k^i$. The first set represents the boundaries for the first two bits (i=1,2) and is simply the midpoints between the constellation points as well as zero. The second set contains the additional boundaries for bit value 0 of bit three and upwards ($b_i$=0, i=3, ..., m). The third set contains the additional boundaries for bit value 1 of bit three and upwards ($b_i$=1, i=3, ..., m). To see this, consider the first bit (topmost row in FIG. 12); the regions for $b_1$=0 (and $b_1$=1) are simply the midpoints of the constellation points, i.e., $$\left\{-\frac{a_7+a_8}{2}, \ldots, -\frac{a_1+a_2}{2}\right\}, \quad x \in X_0^{(i)}$$

$$\left\{\frac{a_1+a_2}{2}, \ldots, \frac{a_7+a_8}{2}\right\}, \quad x \in X_1^{(i)}$$

For the second bit ($b_2$=0, second row from the top), the regions are the midpoints described above, except for the boundary between $-a_5$ (0010) and $a_5$ (1010), which results from two symbols which are not adjacent to each other. This boundary is equal to 0. Hence the first set contains the boundaries $$S_1' = \left\{\pm\frac{a_i+a_{i+1}}{2}, 0\right\}, \quad i=1, \ldots, \frac{M}{2}-1$$

Subsequent bits will introduce new boundaries and to analyse them, it is easier to start with the last one (bottom row), i.e., to consider bit i=m. Regardless of the size of the constellation, the last row will always contain groups of two neighbouring symbols representing the same bit value ($b_i$). The new boundaries are the ones between two such groups of symbols; within a group the boundaries will belong to the first set, $S_1'$.

For $b_m$=0, the new boundaries will be $\pm\frac{1}{2}(a_1+a_4)$, $\pm\frac{1}{2}(a_5+a_8)$, . . . , $$\pm\frac{1}{2}\left(a_{\frac{M}{2}-3} + a_{M/2}\right).$$

Looking at the penultimate bit (i=m−1), symbols where $b_{m-1}$=0 come in groups of four. The additional boundaries are therefore $\pm\frac{1}{2}(a_2+a_7)$, $\pm\frac{1}{2}(a_{10}+a_{15})$ . . . , $$\pm\frac{1}{2}\left(a_{\frac{M}{2}-6} + a_{\frac{M}{2}-1}\right).$$

This pattern will repeat as bits i=m−2, . . . , 3 are considered. The groups of symbols with the same bit value double in size each time i is decreased by one, so the additional boundaries can be generalised as $$S_2' = \left\{\pm\frac{a_{(4k+1)2^{m-i}} + a_{(4k+3)2^{m-i}+1}}{2}, 0\right\},$$
$$k=0, \ldots, 2^{i-3}-1, i=3, \ldots, m$$

A similar analysis can be applied for bit value $b_i$=1. From the last bit (last row in FIG. 12), it is clear that the groups of symbols with $b_m$=1 are the same as those for $b_m$=0 except that they are shifted by two. For i=m−1, the groups are shifted by four etc; this can be generalised to $2 \cdot 2^{m-i}$. This means that the additional boundaries can be expressed as $$S_3' = \left\{\pm\frac{a_{(4k+3)2^{m-i}} + a_{(4k+5)2^{m-i}+1}}{2}, 0\right\},$$
$$k=0, \ldots, 2^{i-3}-2, i=4, \ldots, m$$

All boundaries can now be expressed as the union of these three sets $$S' = S_1' \cup S_2' \cup S_3'$$

Note that between two consecutive boundaries, the nearest symbols $x_0^{(i)}$ and $x_1^{(i)}$ to the received signal will not change and consequently the LLR is a linear function of the received signal. The number of boundaries can now found. For a uniform constellation, some elements of $S_1'$, $S_2'$ and $S_3'$ overlap and hence $|S'|=|S_1'|$=M−1. The number of boundaries can therefore be found as the size of S' which is upper bounded as $$|S'| \le |S_1'| + |S_2'| + |S_3'| = M - 1 + 2\sum_{i=3}^{m} 2^{i-3} + 2\sum_{i=4}^{m}(2^{i-3}-1)$$
$$= 2M - 2m - 1$$
$$= 2M - 2\log_2 M - 1$$

The number of regions is one more than the number of boundaries (if we exclude $s_0$=−∞ and $s_L$=∞), i.e., 2M−2 $\log_2$ M.

The invention claimed is:

1. A device for demodulating a pulse amplitude modulated, hereinafter referred to as PAM, signal, the device comprising:
   memory storing a set of boundaries of regions in which the log likelihood ratio, hereinafter referred to as LLR, for each bit to be determined is represented by a linear function of a received signal, along with the properties of the linear function for each bit for each region; and
   a controller configured to:
   receive a PAM signal to be demodulated;
   determine which region the signal falls within;
   for each bit to be determined, retrieve the properties of the linear function for the LLR for the bit within a determined region and determine, from this linear function, the LLR value for the bit; and
   demodulate the signal based on the determined LLR values.

2. The device of claim 1 wherein:
   the received signal is Gray coded according to a predefined set of symbols, each symbol having its own assigned signal value;
   the properties of the linear function for each region comprise the gradient and the y-intercept of the linear function within the region; and
   the gradient, $\alpha_i$, and y-intercept, $\beta_i$, for the $i^{th}$ bit for each region obey the following equations:

$$\alpha_i = 2(x_1^{(i)} - x_0^{(i)}); \text{ and}$$

$$\beta_i = (x_0^{(i)})^2 - (x_1^{(i)})^2,$$

wherein $x_0^{(i)}$ and $x_1^{(i)}$ are signal values assigned to the closest symbols to the region out of the symbols in which the $i^{th}$ bit equals 0 and 1 respectively.

3. The device of claim 2 wherein determining the LLR value for each bit comprises calculating:

$$LLR_i = \frac{\alpha_i y + \beta_i}{\sigma^2}$$

wherein $LLR_i$ is the log likelihood ratio for the $i^{th}$ bit, $\alpha_i$ is the gradient for the $i^{th}$ bit, $\beta_i$ is the y-intercept for the $i^{th}$ bit, y is the received signal and σ is a noise variance for the signal.

4. The device of claim 1 wherein determining which region the signal falls within comprises:
   (a) ordering the set of boundaries according size, setting a search index to identify a middle boundary of the set of boundaries and setting an initial step size of a quarter of the total number of regions;

(b) determining whether the received signal is greater than the boundary identified by the search index;

(c) if the signal is greater than the boundary identified by the search index, increasing the search index by the step size; otherwise, decreasing the search index by the step size; and (d) determining whether a single region containing the signal has been identified and, if so, determining this region to be the region within which the signal falls; otherwise, halving the step size and repeating steps (b)-(d).

5. The device of claim 4 wherein a single region is identified when the number of times, k', the received signal has been compared to a boundary has reached $\log_2 L$, wherein L is the total number of regions.

6. The device of claim 1, wherein the received signal is Gray-coded according to a predefined set of symbols, each symbol having its own assigned signal value, $\alpha_i$, and wherein the boundaries are located at signal values described by the union of:

$$\left\{\pm \frac{a_i + a_{i+1}}{2}\right\}, i = 1, \ldots, \frac{M}{2} - 1;$$

$$\left\{\pm \frac{a_{(4k+1)2^{m-i}} + a_{(4k+3)2^{m-i}+1}}{2}, 0\right\},$$

$$k = 0, \ldots, 2^{i-3} - 1, i = 3, \ldots, m; \text{ and}$$

$$\left\{\pm \frac{a_{(4k+3)2^{m-i}} + a_{(4k+5)2^{m-i}+1}}{2}\right\},$$

$$k = 0, \ldots, 2^{i-3} - 2, i = 4, \ldots, m,$$

wherein M is the total number of symbols and m is the number of bits assigned to each symbol.

7. The device of claim 1 wherein the boundaries are assigned to signal values at which the LLR value for the bit reverses its sign.

8. The device of claim 1 wherein the linear function for each bit within each region is a linear approximation of the LLR for that bit, and wherein a linear approximation for each region is obtained by minimising the weighted squared error in the region.

9. A method of demodulating a pulse amplitude modulated, hereinafter referred to as PAM, signal, the method comprising:

performing in a device comprising a controller and a memory, the memory storing a set of boundaries of regions in which the log likelihood ratio, hereinafter referred to as LLR, for each bit to be determined is represented by a linear function of a received signal, along with the properties of the linear function for each bit for each region:

receiving a PAM signal to be demodulated;

determining which region the signal falls within;

for each bit to be determined, retrieving the properties of the linear function for the LLR for the bit within the determined region and determining, from this linear function, the LLR value for the bit; and demodulating the signal based on the determined LLR values.

10. The method of claim 9 wherein:

the received signal is Gray coded according to a predefined set of symbols, each symbol having its own assigned signal value;

the properties of the linear function for each region comprise the gradient and the y-intercept of the linear function within the region; and the gradient, $\alpha_i$, and y-intercept, $\beta_i$, for the $i^{th}$ bit for each region obey the following equations:

$$\alpha_i = 2(x_1^{(i)} - x_0^{(i)}); \text{ and}$$

$$\beta_i = (x_0^{(i)})^2 - (x_1^{(i)})^2,$$

wherein $x_0^{(i)}$ and $x_1^{(i)}$ are signal values assigned to the closest symbols to the region out of the symbols in which the $i^{th}$ bit equals 0 and 1 respectively.

11. The method of claim 10 wherein determining the LLR value for each bit comprises calculating:

$$LLR_i = \frac{\alpha_i y + \beta_i}{\sigma^2}$$

wherein $LLR_i$ is the log likelihood ratio for the $i^{th}$ bit, $\alpha_i$ is the gradient for the $i^{th}$ bit, $\beta_i$ is the y-intercept for the $i^{th}$ bit, y is the received signal and $\sigma$ is a noise variance for the signal.

12. The method of claim 9 wherein determining which region the signal falls within comprises:

(a) ordering the set of boundaries according size, setting a search index to identify a middle boundary of the set of boundaries and setting an initial step size of a quarter of the total number of regions;

(b) determining whether the received signal is greater than the boundary identified by the search index;

(c) if the signal is greater than the boundary identified by the search index, increasing the search index by the step size; otherwise, decreasing the search index by the step size; and (d) determining whether a single region containing the signal has been identified and, if so, determining this region to be the region within which the signal falls; otherwise, halving the step size and repeating steps (b)-(d).

13. The method of claim 9, wherein the received signal is Gray-coded according to a predefined set of symbols, each symbol having its own assigned signal value, $\alpha_i$, and wherein the boundaries are located at signal values denoted by:

$$\left\{\pm \frac{a_i + a_{i+1}}{2}\right\}, i = 1, \ldots, \frac{M}{2} - 1;$$

$$\left\{\pm \frac{a_{(4k+1)2^{m-i}} + a_{(4k+3)2^{m-i}+1}}{2}, 0\right\},$$

$$k = 0, \ldots, 2^{i-3} - 1, i = 3, \ldots, m; \text{ and}$$

$$\left\{\pm \frac{a_{(4k+3)2^{m-i}} + a_{(4k+5)2^{m-i}+1}}{2}\right\},$$

$$k = 0, \ldots, 2^{i-3} - 2, i = 4, \ldots, m,$$

wherein M is the total number of symbols and m is the number of bits assigned to each symbol.

14. The method of claim 9 wherein the boundaries are assigned to signal values at which the LLR value for the bit reverses its sign.

15. A non-transient computer readable medium containing program instructions for causing a computer to perform the method of claim 9.

* * * * *